United States Patent
Shaaban et al.

(10) Patent No.: US 11,810,730 B1
(45) Date of Patent: Nov. 7, 2023

(54) HYBRID PEROVSKITE SOLAR CELL WITH ORGANOSELENIUM-BASED POLYMER HOLE TRANSPORT LAYER

(71) Applicant: KING FAISAL UNIVERSITY, Al-Ahsa (SA)

(72) Inventors: Saad El Din El Sayed Elaraby Ibrahim Shaaban, Al-Ahsa (SA); Hany Mohamed Abd El-Lateef Ahmed, Al-Ahsa (SA); Mai Mostafa Khalaf Ali, Al-Ahsa (SA); Ahmed Mohammed Said Lutfi Abdelhady, Al-Ahsa (SA)

(73) Assignee: KING FAISAL UNIVERSITY, Al-Ahsa (SA)

( * ) Notice: Subject to any disclaimer, the term of this patent is extended or adjusted under 35 U.S.C. 154(b) by 0 days.

(21) Appl. No.: 17/903,942

(22) Filed: Sep. 6, 2022

(51) Int. Cl.
| | |
|---|---|
| *H01G 9/20* | (2006.01) |
| *H10K 30/30* | (2023.01) |
| *H10K 30/40* | (2023.01) |
| *H10K 30/82* | (2023.01) |
| *H10K 85/30* | (2023.01) |
| *H10K 85/10* | (2023.01) |

(52) U.S. Cl.
CPC ............ *H01G 9/2009* (2013.01); *H10K 30/30* (2023.02); *H10K 30/40* (2023.02); *H10K 30/82* (2023.02); *H10K 85/111* (2023.02); *H10K 85/30* (2023.02)

(58) Field of Classification Search
CPC ...... H01G 9/2009; H10K 30/40; H10K 30/30; H10K 30/82; H10K 85/30; H10K 85/111
See application file for complete search history.

(56) References Cited

U.S. PATENT DOCUMENTS

| | | | |
|---|---|---|---|
| 10,115,917 B2 | 10/2018 | Marks et al. | |
| 2016/0013434 A1* | 1/2016 | Snaith | H10K 85/00 136/252 |

FOREIGN PATENT DOCUMENTS

| | | |
|---|---|---|
| CN | 107910444 A | 4/2018 |
| CN | 108878653 A | 11/2018 |
| CN | 110808333 A | 2/2020 |

OTHER PUBLICATIONS

Wu et al., "Recoverable Polyimides. (11): DSC Studies of Copolymers from 4, 4'-Dithiodianiline Bismaleimide (DTDA-BM) and Aromatic Diamines", Polymers for Advanced Technologies, vol. I , pp. 253-261. (Year: 1990).*

(Continued)

*Primary Examiner* — Tae-Sik Kang
(74) *Attorney, Agent, or Firm* — Nath, Goldberg & Meyer; Richard C. Litman (57) ABSTRACT

The hybrid perovskite solar cell with an organoselenium-based polymer hole transport layer includes an optically transparent first electrode layer, an electron transport layer, and a perovskite layer. The electron transport layer is sandwiched between the optically transparent first electrode layer and the perovskite layer. The hybrid perovskite solar cell with an organoselenium-based polymer hole transport layer further includes a hole transport layer and a second electrode layer. The perovskite layer is sandwiched between the electron transport layer and the hole transport layer, and the hole transport layer is sandwiched between the perovskite layer and the second electrode layer. The hole transport layer is formed from an organoselenium-based polymer.

8 Claims, 9 Drawing Sheets

(56) References Cited

OTHER PUBLICATIONS

Font et al., "Molecular descriptors calculation as a tool in the analysis of the antileishmanial activity achieved by two series of diselenide derivatives. An insight into its potential action mechanism", Journal of Molecular Graphics and Modelling 60 (2015) 63-78. (Year: 2015).*
An et al., "Aromatic diselenide crosslinkers to enhance the reprocessability and self-healing of polyurethane thermosets", Polym. Chem., 2017, 8, 3641. (Year: 2017).*
Wu et al., "Recoverable Polyimides. (11): DSC Studies of Copolymers from 4, 4'-Dithiodianiline Bismaleimide (DTDA-BM) and Aromatic Diamines", Polymers for Advanced Technologies, 1990, vol. I , pp. 253-261. (Year: 1990).*
Fu, Yajie, et al. "Selenium-containing D-A-D-type dopant-free hole transport materials for perovskite solar cells." Dyes and Pigments 191 (2021): 109339.

* cited by examiner

HYBRID PEROVSKITE SOLAR CELL WITH ORGANOSELENIUM-BASED POLYMER HOLE TRANSPORT LAYER

BACKGROUND

1. Field

The disclosure of the present patent application relates to perovskite solar cells, and particularly to a hybrid perovskite solar cell with an organoselenium-based polymer hole transport layer.

2. Description of the Related Art

Figure 2:
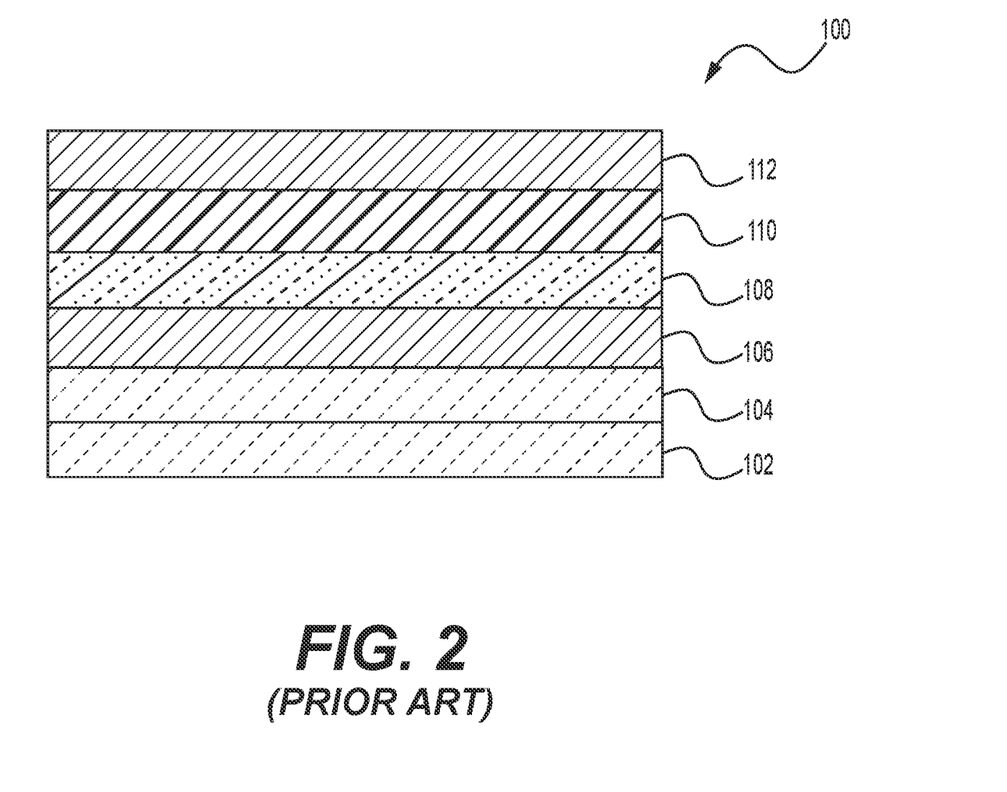
FIG. 2 is a side view in section of a conventional prior art perovskite solar cell.
Figure 3:
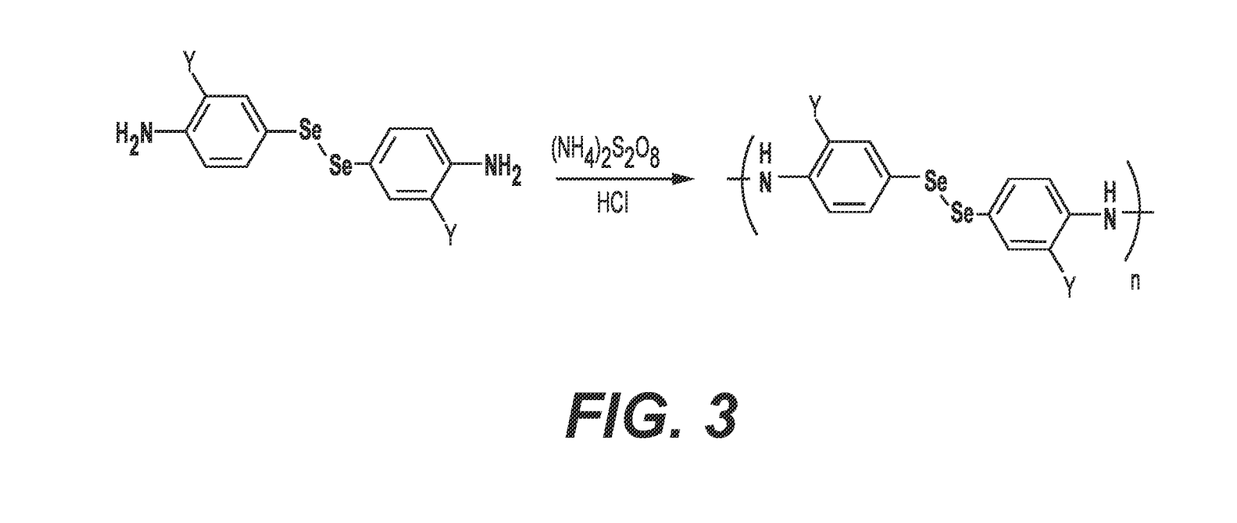
FIG. 3 illustrates the synthesis of the organoselenium-based polymer hole transport layer made of monomers (M1).
Figure 4:
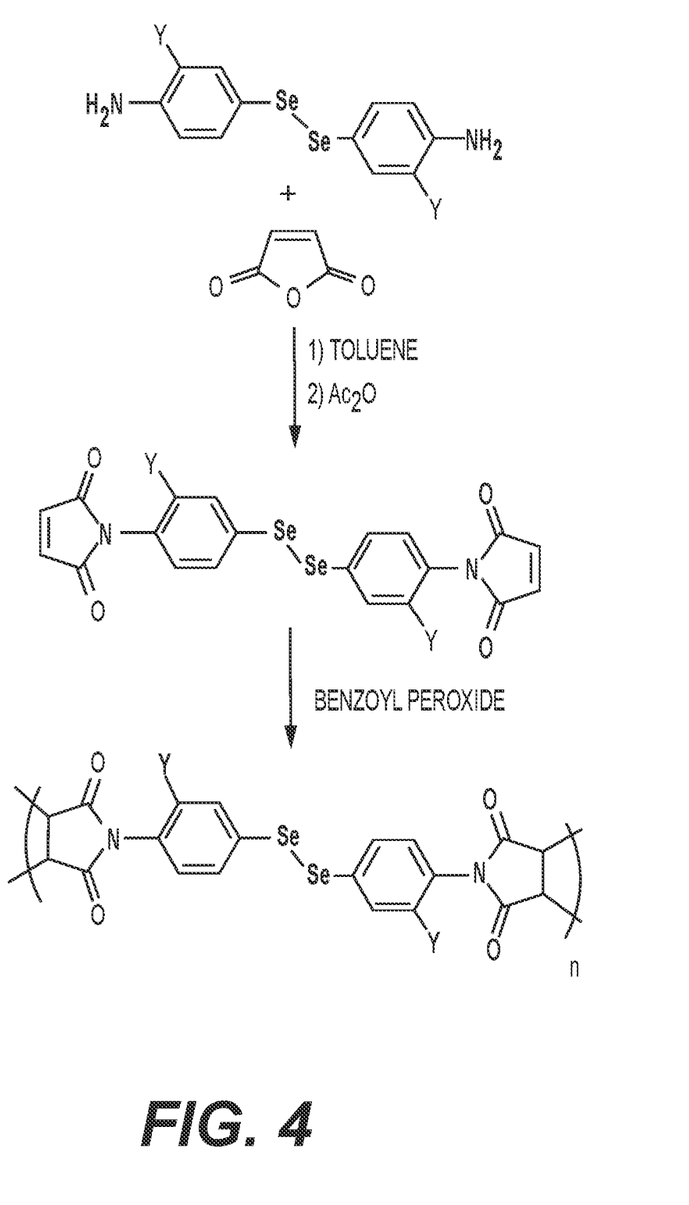
FIG. 4 illustrates the synthesis of the organoselenium-based polymer hole transport layer made of monomers (M2).
Figure 5:
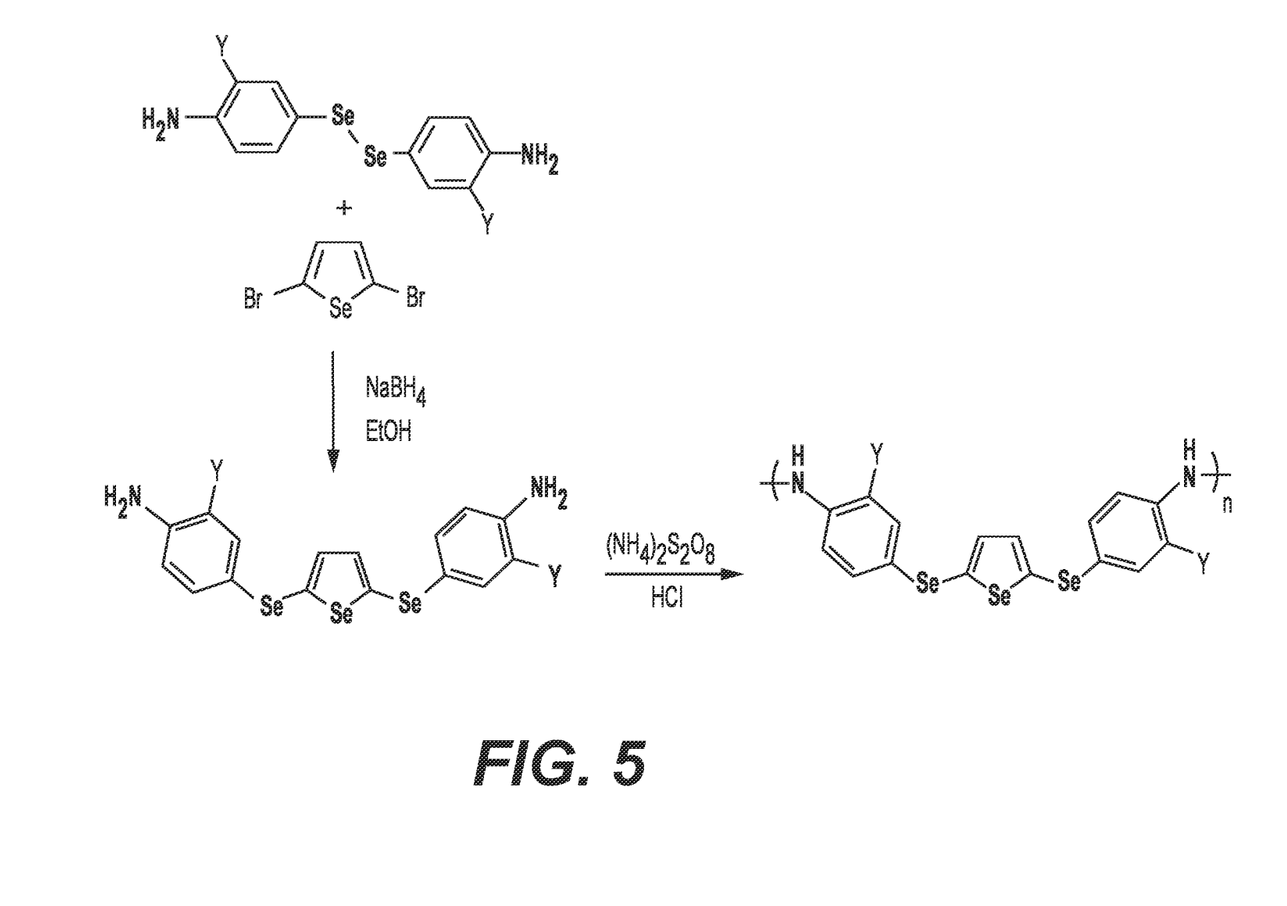
FIG. 5 illustrates the synthesis of the organoselenium-based polymer hole transport layer made of monomers (M3).
Figure 6:
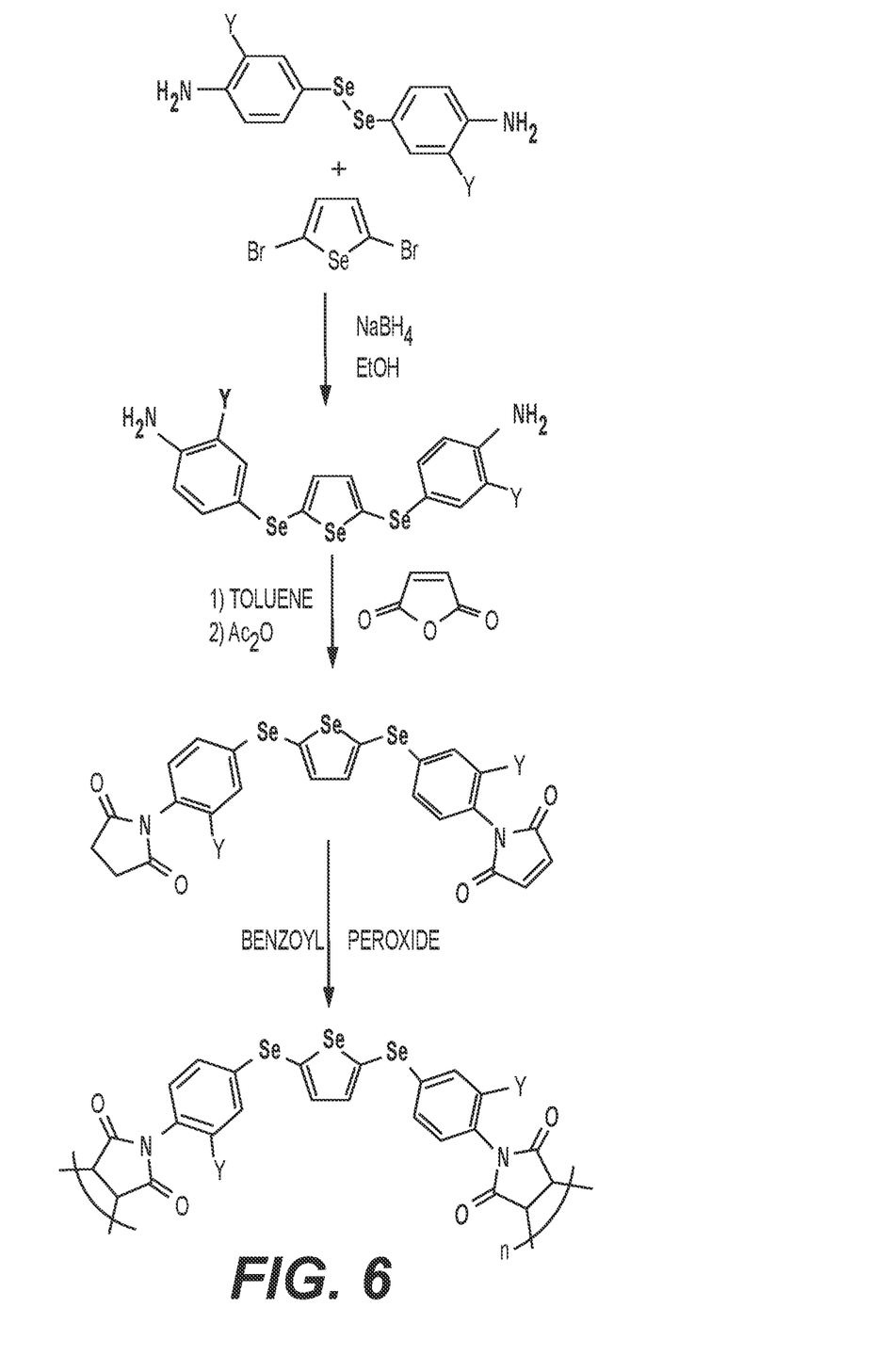
FIG. 6 illustrates the synthesis of the organoselenium-based polymer hole transport layer made of monomers (M4).
Figure 7:
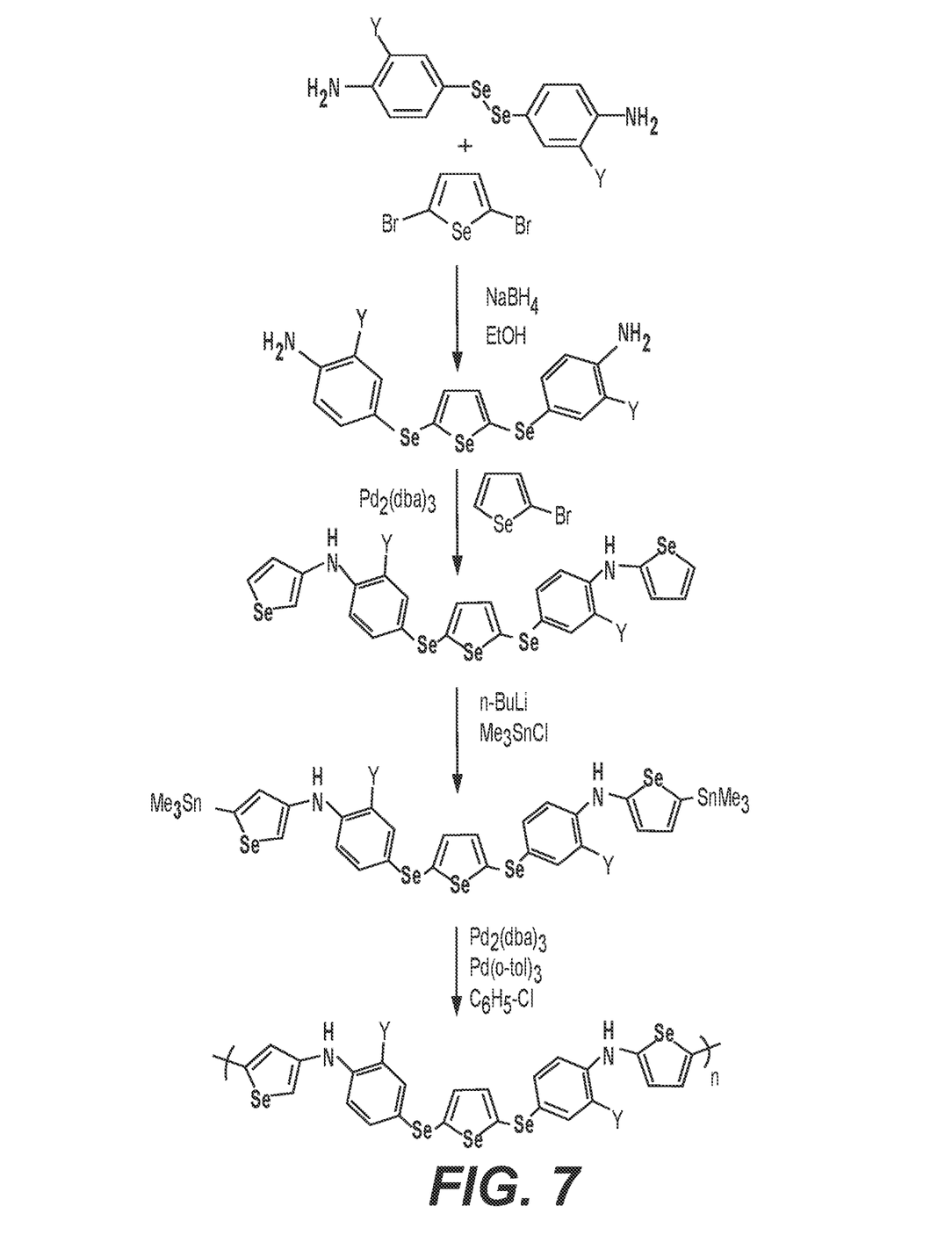
FIG. 7 illustrates the synthesis of the organoselenium-based polymer hole transport layer made of monomers (M5).
Figure 8:
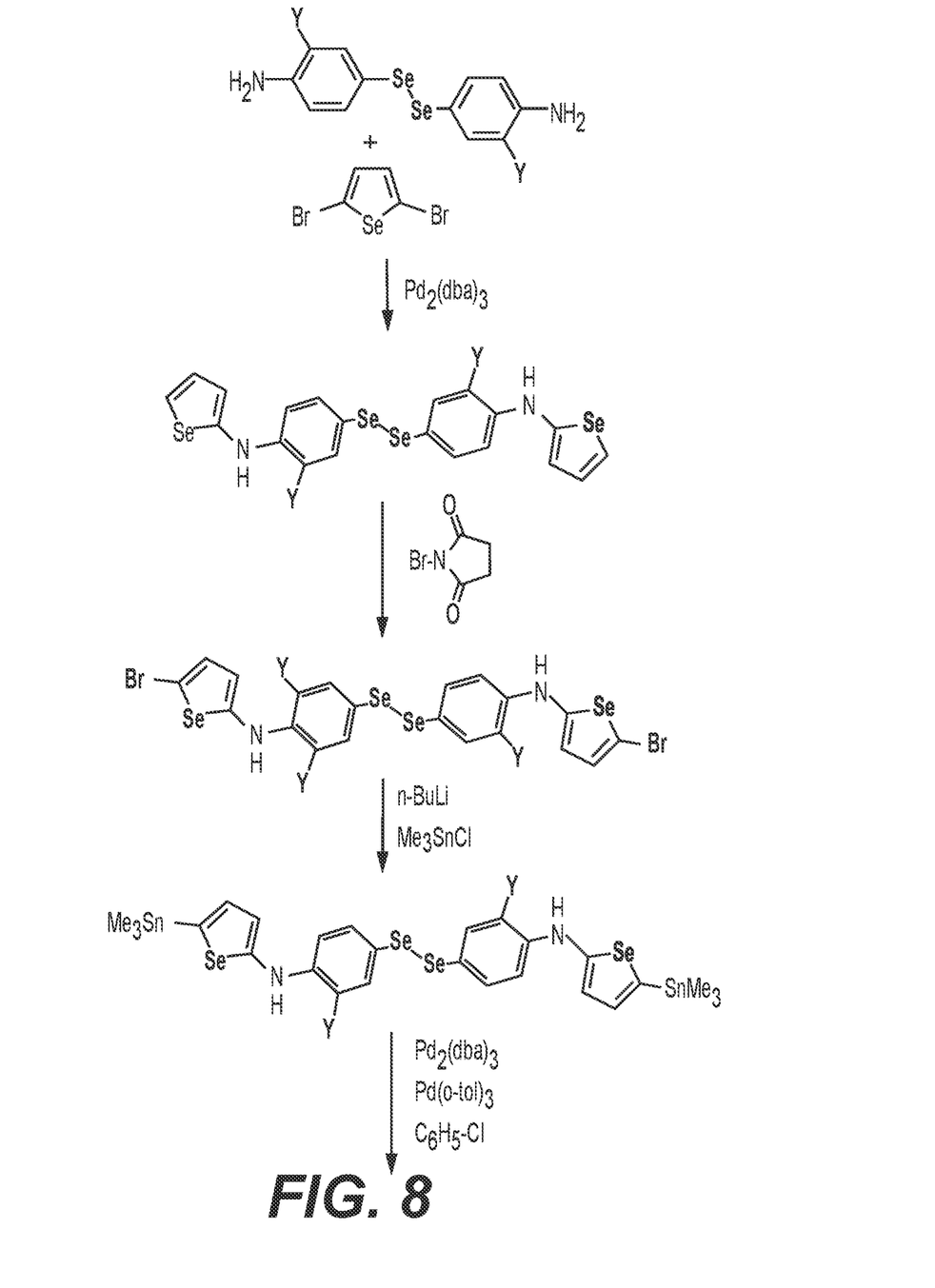
FIG. 8 illustrates the synthesis of the organoselenium-based polymer hole transport layer made of monomers (M6).

As shown in FIG. 2, a typical perovskite solar cell includes an optically transparent cathode layer 104, which is typically formed on a glass layer 102. An example of such an optically transparent and electrically conductive material which may be used to form electrode 104 is indium tin oxide (ITO). Fluorine tin oxide (FTO) is another example of a common material used to make the optically transparent electrode layer 104. An electron transport layer (ETL) 106 is formed on the ITO layer 104, and a layer of perovskite crystal 108 is sandwiched between the ETL 106 and a hole transport layer (HTL) 110. Commonly used ETL materials include titanium dioxide ($TiO_2$), tin dioxide ($SnO_2$) $C_{60}$, and zinc oxide (ZnO). The most commonly used HTL material in conventional perovskite solar cells is the conducting polymer blend poly(3,4-ethylenedioxythiophene):polystyrene sulfonate (PEDOT:PSS). The most common perovskite absorber is methylammonium lead trihalide ($CH_3NH_3PbX_3$), where X is a halogen ion, such as iodide, bromide, or chloride, and which has an optical bandgap between ~1.55 and 2.3 eV, depending on halide content. Formamidinium lead trihalide ($H_2NCHNH_2PbX_3$) has also shown promise, with bandgaps between 1.48 and 2.2 eV. Its minimum bandgap is closer to the optimal for a single-junction cell than methylammonium lead trihalide, so it should be capable of higher efficiencies. Perovskite layers, such as layer 108, are commonly made from these exemplary materials, as well as similar organometal halide perovskites. An anode layer 112 is formed on the HTL 110, and such anodes are typically formed from gold or silver.

Due to the ionic nature of halide perovskites, traditional perovskite solar cells, such as prior art perovskite solar cell 100, exhibit relatively low stability in oxygen-containing and humid environments. Although attempts have been made previously to incorporate a passivation layer into the cell to protect the perovskite, such layers have been found to either be poor conductors or cause a trade-off between series resistance and passivation efficiency. Thus, a hybrid perovskite solar cell with an organoselenium-based polymer hole transport layer solving the aforementioned problems is desired.

SUMMARY

The hybrid perovskite solar cell with an organoselenium-based polymer hole transport layer includes an optically transparent first electrode layer, an electron transport layer, and a perovskite layer. The electron transport layer is sandwiched between the optically transparent first electrode layer and the perovskite layer. The optically transparent first electrode layer may be formed from any suitable type of optically transparent and electrically conductive material suitable for usage in a perovskite solar cell. Non-limiting examples of such materials include indium tin oxide (ITO) and fluorine tin oxide (FTO).

As in a conventional perovskite solar cell, the optically transparent first electrode layer may be coated on a glass substrate, with the optically transparent first electrode layer sandwiched between the glass substrate and the electron transport layer. The electron transport layer may be formed from any suitable type of electron transport material suitable for usage in a perovskite solar cell. Non-limiting examples of such material include titanium dioxide ($TiO_2$), tin dioxide ($SnO_2$) $C_{60}$, and zinc oxide (ZnO). The perovskite layer may be formed from any suitable type of perovskite suitable for usage in a perovskite solar cell. Non-limiting examples of such perovskites include methylammonium lead trihalide ($CH_3NH_3PbX_3$) and formamidinium lead trihalide ($H_2NCHNH_2PbX_3$), where X is a halogen ion, such as iodide, bromide, or chloride.

The hybrid perovskite solar cell with an organoselenium-based polymer hole transport layer further includes a hole transport layer and a second electrode layer. The perovskite layer is sandwiched between the electron transport layer and the hole transport layer, and the hole transport layer is sandwiched between the perovskite layer and the second electrode layer. The second electrode layer may be formed from any suitable type of anode material suitable for usage in a perovskite solar cell. Non-limiting examples of such anode materials include gold and silver.

The hole transport layer is formed from an organoselenium-based polymer. The polymer is formed from repeating monomer units, and the monomer may be any one of the following six monomers M1-M6:

-continued

M3

M4

,

M5

, and

M6

In the above, Y may be H, COOH, COOEt, or COOMe.

The organoselenium-based polymer hole transport layer made from any of monomers M1-M6 is a waterproof polymer, thus providing surface passivation for the perovskite layer. This surface passivation for the perovskite layer improves the solar cell's tolerance to oxygen-containing and/or humid environments, and also enhances the open-circuit voltage ($V_{oc}$) of the solar cell. The organoselenium-based polymer hole transport layers have also been found to maintain exceptional interfacial transport and charge collection activities. This results in a high fill factor (FF) and reduced series resistance.

These and other features of the present invention will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
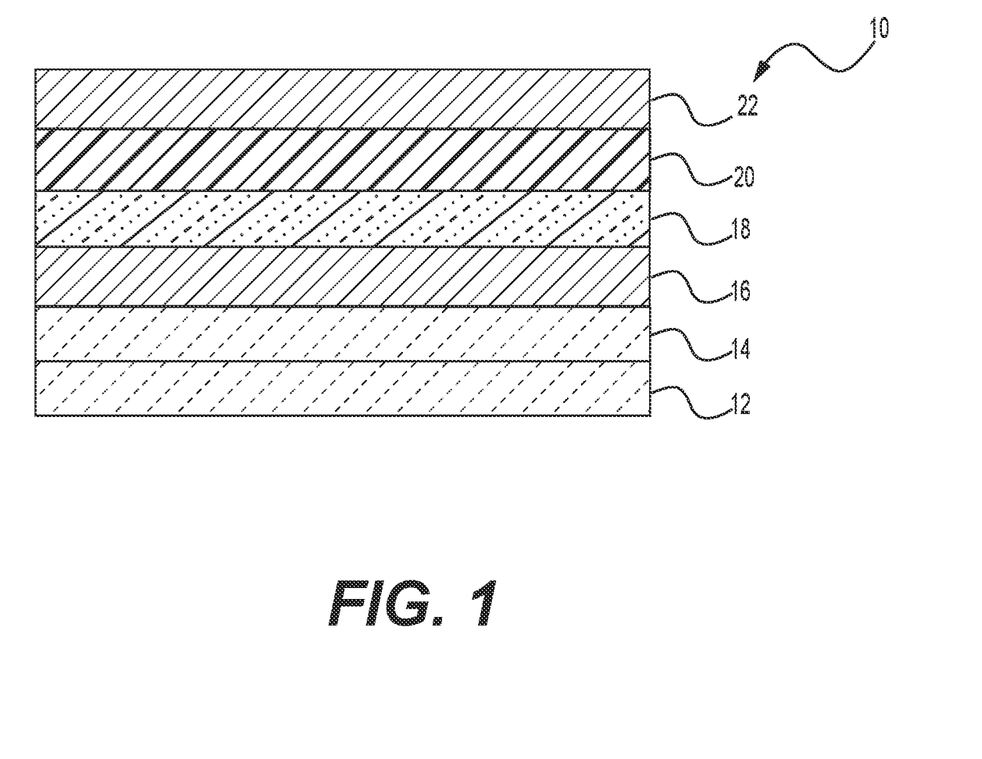
FIG. 1 is a side view in section of a hybrid perovskite solar cell with an organoselenium-based polymer hole transport layer.

As shown in FIG. 1, the hybrid perovskite solar cell with an organoselenium-based polymer hole transport layer 10 includes an optically transparent first electrode layer 14, an electron transport layer 16, and a perovskite layer 18. The electron transport layer 16 is sandwiched between the optically transparent first electrode layer 14 and the perovskite layer 18. The optically transparent first electrode layer 14 may be formed from any suitable type of optically transparent and electrically conductive material suitable for usage in a perovskite solar cell. Non-limiting examples of such materials include indium tin oxide (ITO) and fluorine tin oxide (FTO).

As in a conventional perovskite solar cell, the optically transparent first electrode layer 14 may be coated on a glass substrate 12, with the optically transparent first electrode layer 14 sandwiched between the glass substrate 12 and the electron transport layer 16. The electron transport layer 16 may be formed from any suitable type of electron transport material suitable for usage in a perovskite solar cell. Non-limiting examples of such material include titanium dioxide ($TiO_2$), tin dioxide ($SnO_2$) $C_{60}$, and zinc oxide (ZnO). The perovskite layer 18 may be formed from any suitable type of perovskite suitable for usage in a perovskite solar cell. Non-limiting examples of such perovskites include methylammonium lead trihalide ($CH_3NH_3PbX_3$) and formamidinium lead trihalide ($H_2NCHNH_2PbX_3$), where X is a halogen ion, such as iodide, bromide, or chloride.

The hybrid perovskite solar cell with an organoselenium-based polymer hole transport layer 10 further includes a hole transport layer 20 and a second electrode layer 22. The perovskite layer 18 is sandwiched between the electron transport layer 16 and the hole transport layer 20, and the hole transport layer 20 is sandwiched between the perovskite layer 18 and the second electrode layer 22. The second electrode layer 22 may be formed from any suitable type of anode material suitable for usage in a perovskite solar cell. Non-limiting examples of such anode materials include gold and silver.

The hole transport layer 20 is formed from an organoselenium-based polymer. The polymer is formed from repeating monomer units, and the monomer may be any one of the following six monomers M1-M6:

In the above, Y may be H, COOH, COOEt, or COOMe.

FIGS. 3-8 respectively show the synthesis schemes for organoselenium-based polymer hole transport layers made of monomers M1-M6. The organoselenium-based polymer hole transport layer made from any of monomers M1-M6 is a waterproof polymer, thus providing surface passivation for the perovskite layer. This surface passivation for the perovskite layer improves the solar cell's tolerance to oxygen-containing and/or humid environments, and also enhances the open-circuit voltage ($V_{oc}$) of the solar cell. The organoselenium-based polymer hole transport layers have also been found to maintain exceptional interfacial transport and charge collection activities. This results in a high fill factor (FF) and reduced series resistance. Further, the organoselenium-based polymer interacts chemically with $Pb^{2+}$ ions (through the Se lone pair) on the surface of the hybrid perovskite, thus passivating undercoordinated ions.

It is to be understood that the hybrid perovskite solar cell with an organoselenium-based polymer hole transport layer is not limited to the specific embodiments described above, but encompass any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A hybrid perovskite solar cell with an organoselenium-based polymer hole transport layer, comprising:

an optically transparent first electrode layer;

an electron transport layer;

a perovskite layer, wherein the electron transport layer is sandwiched between the optically transparent first electrode layer and the perovskite layer;

a hole transport layer, wherein the perovskite layer is sandwiched between the electron transport layer and the hole transport layer; and a second electrode layer, wherein the hole transport layer is sandwiched between the perovskite layer and the second electrode layer, wherein the hole transport layer comprises an organoselenium-based polymer having a monomer selected from the group consisting of:

wherein Y is selected from the group consisting of H, COOH, COOEt, and COOMe.

2. The hybrid perovskite solar cell with the organoselenium-based polymer hole transport layer as recited in claim 1, further comprising a glass layer, wherein the optically transparent first electrode layer is sandwiched between the glass layer and the electron transport layer.

3. The hybrid perovskite solar cell with the organoselenium-based polymer hole transport layer as recited in claim 1, wherein the monomer of the organoselenium-based polymer has the structure:

4. The hybrid perovskite solar cell with the organoselenium-based polymer hole transport layer as recited in claim 1, wherein the monomer of the organoselenium-based polymer has the structure:

5. The hybrid perovskite solar cell with the organoselenium-based polymer hole transport layer as recited in claim 1, wherein the monomer of the organoselenium-based polymer has the structure:

6. The hybrid perovskite solar cell with the organoselenium-based polymer hole transport layer as recited in claim 1, wherein the monomer of the organoselenium-based polymer has the structure:

7. The hybrid perovskite solar cell with the organoselenium-based polymer hole transport layer as recited in claim 1, wherein the monomer of the organoselenium-based polymer has the structure:

8. The hybrid perovskite solar cell with the organoselenium-based polymer hole transport layer as recited in claim 1, wherein the monomer of the organoselenium-based polymer has the structure:

* * * * *